(12) United States Patent
Chen

(10) Patent No.: US 10,014,342 B1
(45) Date of Patent: Jul. 3, 2018

(54) LED FILAMENT AND LAMP

(71) Applicant: Zhejiang Dingxin Arts & Crafts Co., Ltd., Taizhou (CN)

(72) Inventor: Xiang Chen, Taizhou (CN)

(73) Assignee: ZHEJIANG DINGXIN ARTS & CRAFTS CO., LTD., Taizhou (CN)

( * ) Notice: Subject to any disclaimer, the term of this patent is extended or adjusted under 35 U.S.C. 154(b) by 0 days.

(21) Appl. No.: 15/664,039

(22) Filed: Jul. 31, 2017

(30) Foreign Application Priority Data

Mar. 13, 2017 (CN) .......................... 2017 1 0145266
Mar. 13, 2017 (CN) .......................... 2017 2 0237171

(51) Int. Cl.
*F21S 4/28* (2016.01)
*H01L 27/15* (2006.01)
*H01L 33/62* (2010.01)

(52) U.S. Cl.
CPC ............ *H01L 27/153* (2013.01); *H01L 33/62* (2013.01)

(58) Field of Classification Search
CPC ... H01L 27/153; H01L 33/62; H01L 25/0753; F21V 3/00; F21V 29/004; F21V 29/70; F21V 19/003; F21V 19/005; F21V 19/0035; F21Y 2115/10; F21Y 2107/00; F21K 9/00–9/90; F21S 4/24–4/28
See application file for complete search history.

(56) References Cited

U.S. PATENT DOCUMENTS 6,371,637 B1 * 4/2002 Atchinson ............. F21V 19/005
  362/249.04
2014/0312365 A1 * 10/2014 Ishikura .............. H01L 25/0753
  257/88
2014/0369036 A1 * 12/2014 Feng ........................ F21K 9/23
  362/223

* cited by examiner

*Primary Examiner* — Joseph C Nicely
*Assistant Examiner* — Pavel Ivanov
(74) *Attorney, Agent, or Firm* — Hemisphere Law, PLLC; Zhigang Ma

(57) ABSTRACT

A LED filament includes LED chips, a first bracket and a second bracket. The LED chips are secured on the first bracket and/or the second bracket. The first bracket and the second bracket are made out of metal. Two ends of each of the LED chips are electrically connected with the first bracket and the second bracket, or the plurality of LED chips are divided into groups of serially connected LED chips. Two ends of each of the groups of serially connected LED chips are electrically connected with the first bracket and the second bracket.

20 Claims, 12 Drawing Sheets

LED FILAMENT AND LAMP

FIELD OF THE DISCLOSURE

The disclosure relates to a filament field, and more particularly to a LED filament and a lamp.

BACKGROUND

A revolutionarily novel light source LED derived from the 20th century has rapidly been popular on the illumination market due to advantages such as energy conservation and environment protection, as well as the long service life. The LED has become the mainstream light source in the future to be widely applied in commercial illumination, industrial illumination, outdoor illumination, etc. But the development of the LED is relatively slow in civil illumination. A LED lamp was too new to be heard about for most people. A LED filament bulb introduced by Ushio Lighting changed the situation in 2008. The bulb lamp is an incandescent lamp disposed with the LED, which keeps the conventional look but upgrades the recipe. The LED lamp can be seen to be used for illumination by its appearance. Candle lamps, quartz lamps and bulbs utilizing LED filaments as light sources initiate to be launched in large amounts subsequently, and accepted by more and more consumers.

A patent No. CN104241501A disclosed an all-direction plant growth lamp LED filament, including a long-strip-shaped transparent substrate and metal supports fixed to the two ends of the transparent substrate. A plurality of blue light LED chips are fixed to the transparent substrate and form one or more lines of LED strings penetrating through the transparent substrate, and the blue light LED chips in each LED string are connected in series through a wire; the blue light LED chips located at the two ends of the transparent substrate are connected to the supports through wires respectively; the exterior of the transparent substrate is wrapped by a red fluorescent layer, the red fluorescent layer is formed by mixing a red fluorescent powder and a cross-linking agent.

The slight deformation of a conventional LED filament will lead to the line rupture or destruction of the LED chip, which will cause the LED filament to break down.

SUMMARY

In order to solve the problem above, the disclosure provides a LED filament that is not easily destroyed.

In order to achieve the advantage above, the disclosure provides a LED filament, including a plurality of LED chips, a first bracket and a second bracket. The LED chips are securely connected with the first bracket and/or the second bracket. The first bracket and the second bracket are made out of metal. Two ends of the LED chips are each electrically connected with the first bracket and the second bracket, or the plurality of LED chips are divided into groups of serially connected LED chips. Two ends of each of the groups of serially connected LED chips are electrically connected with the first bracket and the second bracket.

In an embodiment of the disclosure, the first bracket includes a die bonding section. The die bonding section includes a die bonding region and a connection region. A cross-sectional area of the die bonding region is larger than a cross-sectional area of the connection region. The LED chips are fixed in the die bonding region.

In an embodiment of the disclosure, a cross-sectional area of the die bonding section gradually decreases from middle of the die bonding region to middle of the connection region.

In an embodiment of the disclosure, the die bonding region and the connection region are plate-shaped structures. A first border of the die bonding region and the connection region adjacent to the second bracket and a surface of the die bonding region fixing the LED chips are perpendicular. A sectional curve of the first border and the surface of the die bonding region fixing the LED chips is a sinusoid.

In an embodiment of the disclosure, a gap is between the first bracket and the second bracket.

In an embodiment of the disclosure, the first bracket and the second bracket are wrapped by a transparent layer.

In an embodiment of the disclosure, a first lead and a second lead are extended out of the transparent layer from the first bracket and the second bracket.

In an embodiment of the disclosure, the second lead is located on an end of the second bracket adjacent to the first lead.

In an embodiment of the disclosure, the first bracket and the second bracket are mutually fixed by an insulating member.

In an embodiment of the disclosure, the insulating member is made out of epoxy resin.

In the disclosure, as the LED chips or each of the groups of LED chips are parallel connected, even though parts of the LED chips are destroyed or the wire is broken, the LED filament will not be completely destroyed.

DETAILED DESCRIPTION OF PREFERRED EMBODIMENTS

In order to further illustrate embodiments employed by the disclosure to achieve the predesignated objective and the efficacy, concrete embodiments, structures, features and the efficacy thereof provided according to the disclosure will be described in detail with reference to preferred embodiments and the accompanying drawings as follows.

Figure 1:
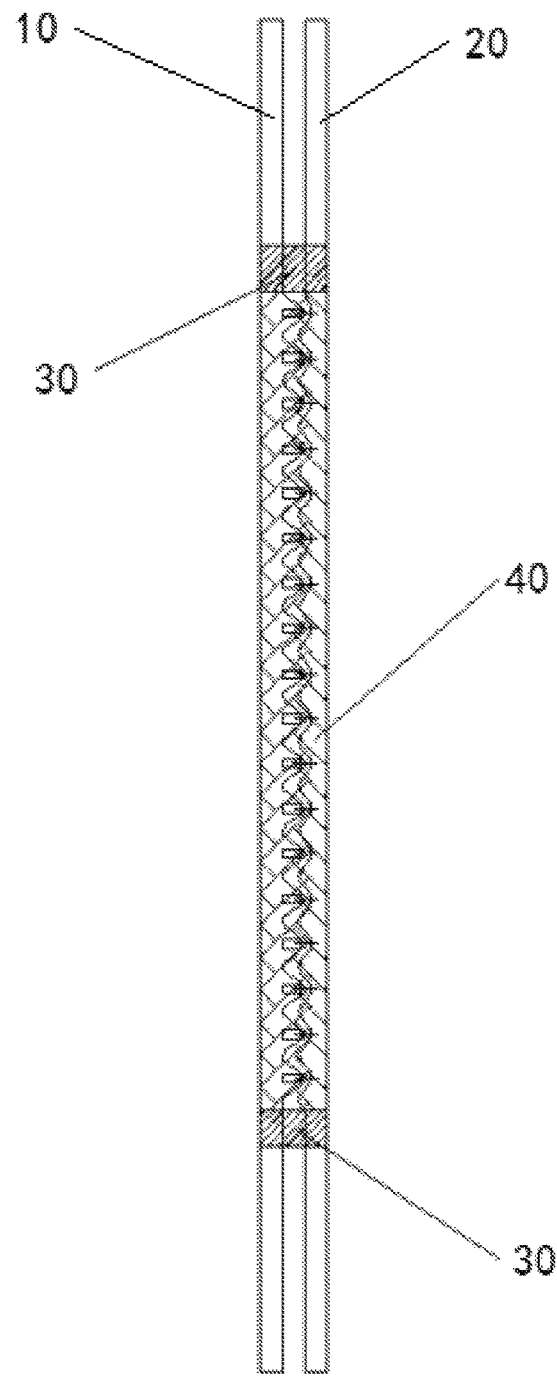
FIG. 1 is a structural schematic view of a LED filament according to a first embodiment of the disclosure.

Referring to FIG. 1, the LED filament of the embodiment includes a first bracket 10, a second bracket 20, insulating members 30 configured to fix the first bracket 10 and the second bracket 20, and a transparent layer 40 wrapping the middle of the first bracket 10 and the second bracket 20. The insulating members 30 are located adjacently to ends of the first bracket 10 and the second bracket 20. The insulating members 30 are preferably to be made out of the epoxy resin. The insulating members 30 can obviously be made out of plastic or rubber as well.

Figure 2:
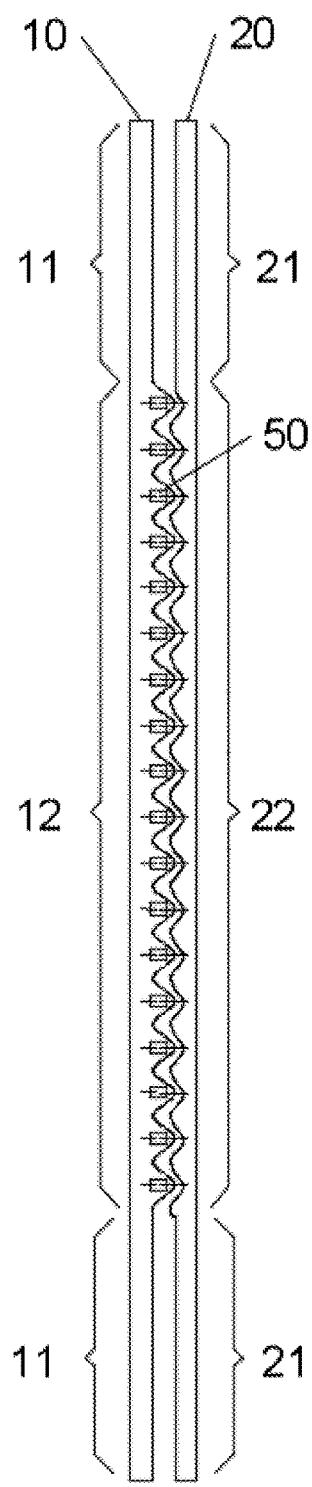
FIG. 2 is a structural schematic view of a first bracket and a second bracket of the LED filament of FIG. 1.

Referring to FIG. 2, the first bracket 10 is divided into first leads 11 and a die bonding section 12. The first leads 11 are located on two ends of the die bonding section 12. The second bracket 20 includes second leads 21 and a power supply section 22. The second leads 21 are located on two ends of the power supply section 22. The first leads 11 and the second leads 21 are configured to connect with a power supply circuit. A gap is between the first bracket 10 and the second bracket 20, which means the first bracket 10 and the second bracket 20 are dielectric. The gap between the first bracket 10 and the second bracket 20 is filled with the transparent layer 40. The LED filament further includes a plurality of LED chips 50. The plurality of LED chips 50 are fixed on the upper surface of the die bonding section 12 to be a line evenly. In other embodiments, the bottom surface of the die bonding section is also fixed with the plurality of LED chips 50. The transparent layer can be a silica layer, an epoxy resin layer, a florescent adhesive layer prepared by silica and florescent powders.

Figure 3:
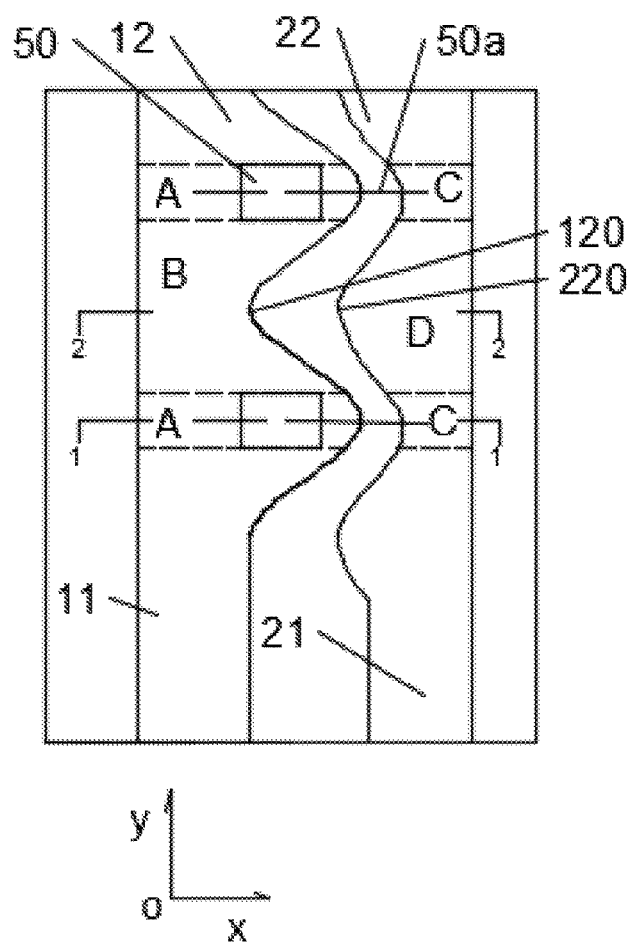
FIG. 3 is a locally enlarged view of a middle section of the first bracket and the second bracket of FIG. 2.
Figure 4A:
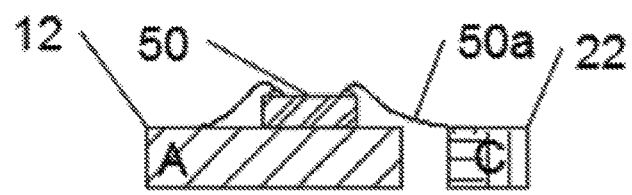
FIG. 4 is a cross-sectional view of FIG. 3 taken along 1-1 and 2-2.
Figure 4B:
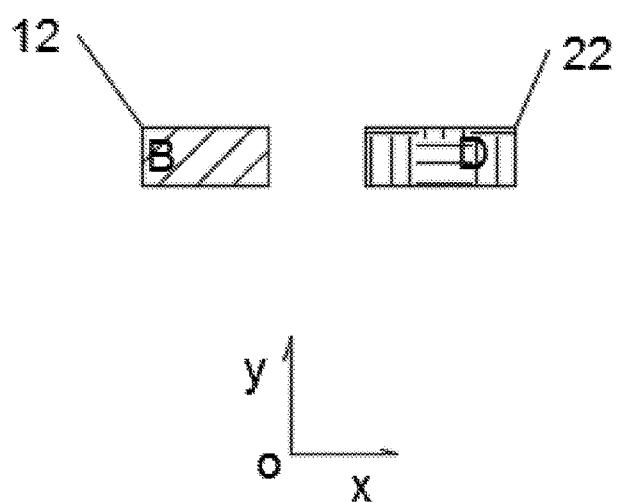

Referring to FIGS. 3 and 4, the die bonding section 12 is a die bonding region A and a connection region B. A cross-sectional area of the die bonding region A is larger than a cross-sectional area of the connection region B. The cross-sectional area is the area of a cross section perpendicular to a lengthwise direction of the first bracket. A width of the die bonding region A is larger than a width of the connection region. The width is measured along the direction x in FIG. 3. The LED chips 50 are fixed on the upper surface of the die bonding region A. Preferably, a cross-sectional area gradually decreases from the middle of the die bonding region A to the middle of the connection region B. A first border surface 120 of the die bonding section 12 towards the power supply section 22 is an undulation surface. The first border surface 120 is perpendicular to the surface of the die bonding section 12 fixing the LED chips 50. An intersecting curve of the first border surface 120 and the surface of the die bonding section 12 fixing the LED chips 50 is a sinusoid $x_1=A_1 \sin(2\pi y/\lambda+\varphi_1)+k_1$. The die bonding region and the connection region are plate-shaped structures.

x is a function of y in a direction from one end to the other end of the first bracket.

$A_1$ is the amplitude. $A_1$ can be 0.5 mm.

$\Phi_1$ is the original phase, aka the phase when y=0, which is the curve shifts up and down reflected on the coordinate.

$k_1$ and $k_2$ are the setover, which are the curve shifts left and right reflected on the coordinate.

ω is an angular velocity, which controls the frequency of vibration of the curve.

The power supply section 22 is a third region C and a fourth region. A cross-sectional area of the third region C is smaller than a cross-sectional area of the fourth region D. A width of the third region C is smaller than a width of the fourth region D. Preferably, a cross-sectional area gradually increases from the middle of the third region C to the middle of the fourth region D. The die bonding region A and the third region C are corresponding. The width of the connection region B and the fourth region D can be relatively small correspondingly to the LED filament. The LED chips 50 are electrically connected with the die bonding region A of the die bonding section 12 and the third region C of the power supply section 22 by a wire 50a in the embodiment. The LED chips 50 are electrically connected with the die bonding region A of the die bonding section 12 and the fourth region D of the power supply section 22 by the wire 50a in another embodiment.

An intersecting curve of the second border surface 220 and the surface of the die bonding section 12 fixing the LED chips 50 is a sinusoid $x_2=A_2 \sin(2\pi y/\lambda+\varphi_2)+k_2$, where y is a variable in a direction from one end to the other end of the power supply section.

$x_2$ is a function of y in a direction from one end to the other end of the longest axis of the second bracket.

x is a variable of a direction from one end to the other end of the first border 120 perpendicular to the power supply section.

$A_2$ is the amplitude. $A_1$ is larger than $A_2$. $A_2$ can be 0.25 mm.

$\Phi_1$ is the original phase, aka the phase when y=0, which is the curve shifts up and down reflected on the coordinate.

$k_1$ and $k_2$ are the setover, which are the curve shifts left and right reflected on the coordinate.

λ is a wavelength.

Two ends of the LED chips 50 are connected with the die bonding section 12 and the power supply section 22 by the wire 50a.

Figure 5:
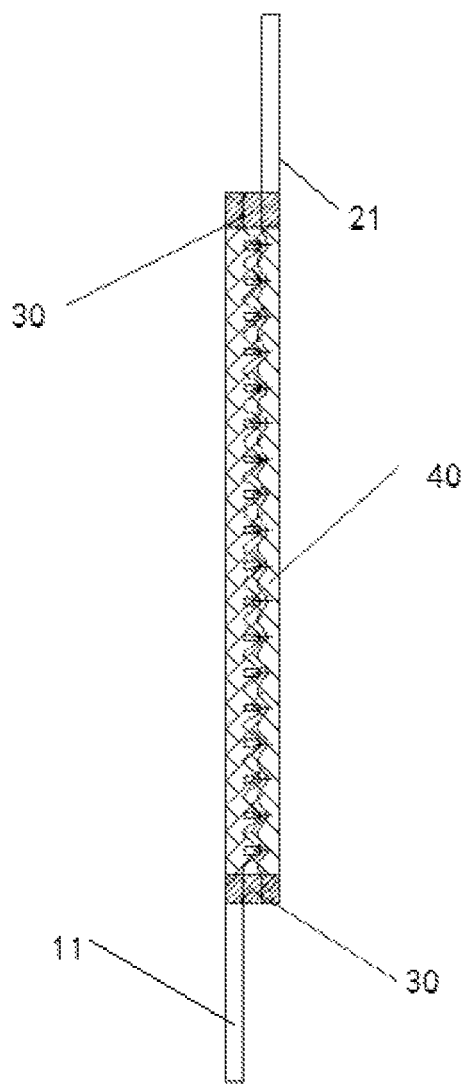
FIG. 5 is a structural schematic view of a LED filament according to a second embodiment of the disclosure.

Referring to FIG. 5, in the embodiment, the first lead 11 is located on one end of the die bonding section. The second lead 21 is located on the end of the power supply section far from the first lead 11.

Figure 6:
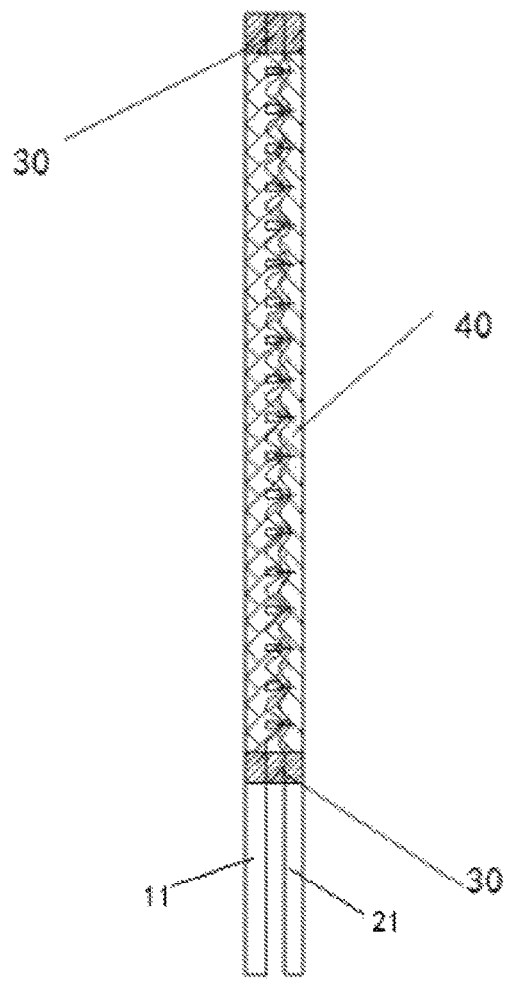
FIG. 6 is a structural schematic view of a LED filament according to a third embodiment of the disclosure.

Referring to FIG. 6, in the embodiment, the first lead 11 is located on one end of the die bonding section. The second lead 21 is located on the end of the power supply section adjacent to the first lead 11.

Figure 7:
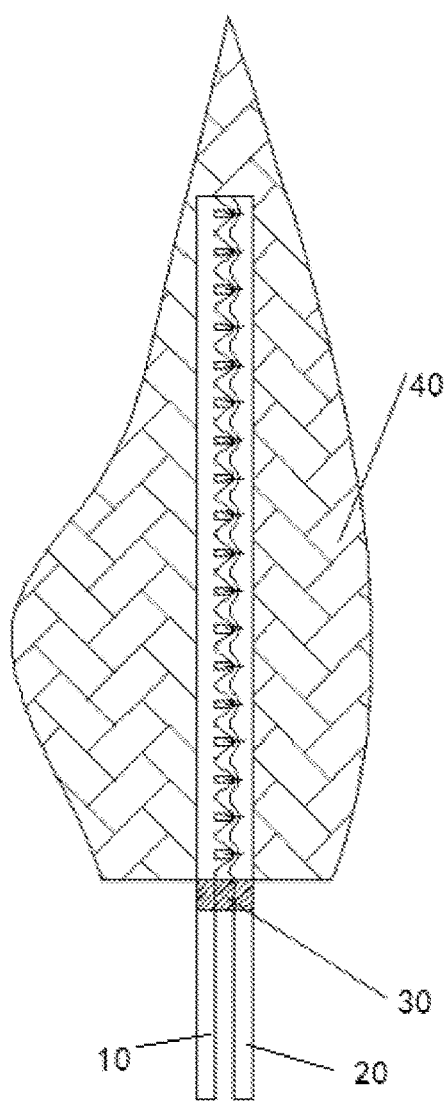
FIG. 7 is a structural schematic view of a LED filament according to a fourth embodiment of the disclosure.

Referring to FIG. 7, in the embodiment, the transparent layer 40 is a flame-shaped structure.

Figure 8:
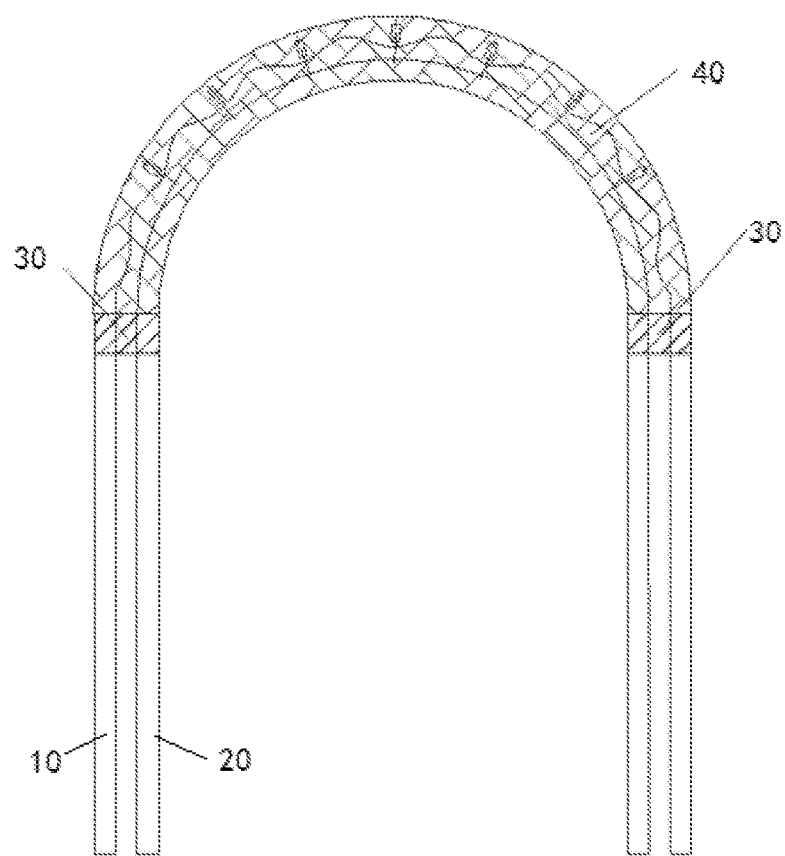
FIG. 8 is a structural schematic view of a LED filament according to a fifth embodiment of the disclosure.

Referring to FIG. 8, in the embodiment, the die bonding section and the power supply section in the middle of the first bracket 10 and the second bracket 20 are arcs.

Figure 9:
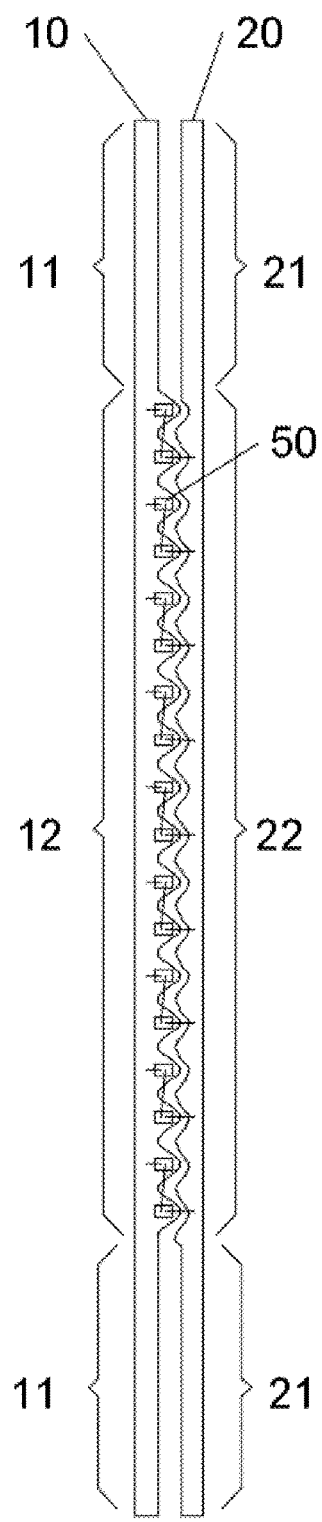
FIG. 9 is a structural schematic view of a LED filament according to a sixth embodiment of the disclosure.

Referring to FIG. 9, in the embodiment, every two LED chips are serially connected to be a group of LED chips. Two ends of each of the groups of LED chips are electrically connected to the first bracket 10 and the second bracket 20 respectively. So that the power supply can be 6V.

Figure 10:
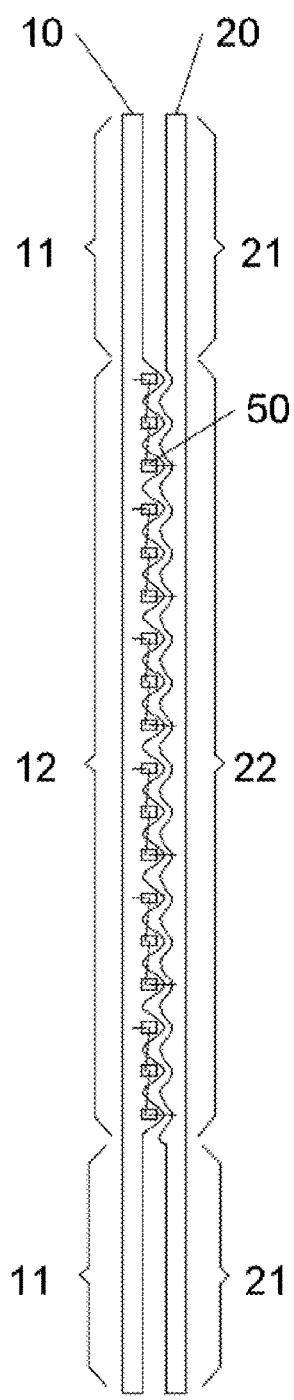
FIG. 10 is a structural schematic view of a LED filament according to a sixth embodiment of the disclosure.

Referring to FIG. 10, in the embodiment, every three LED chips are serially connected to be a group of LED chips. Two ends of each of the groups of LED chips are electrically connected to the first bracket 10 and the second bracket 20 respectively. So that the power supply can be 9V.

Figure 11:
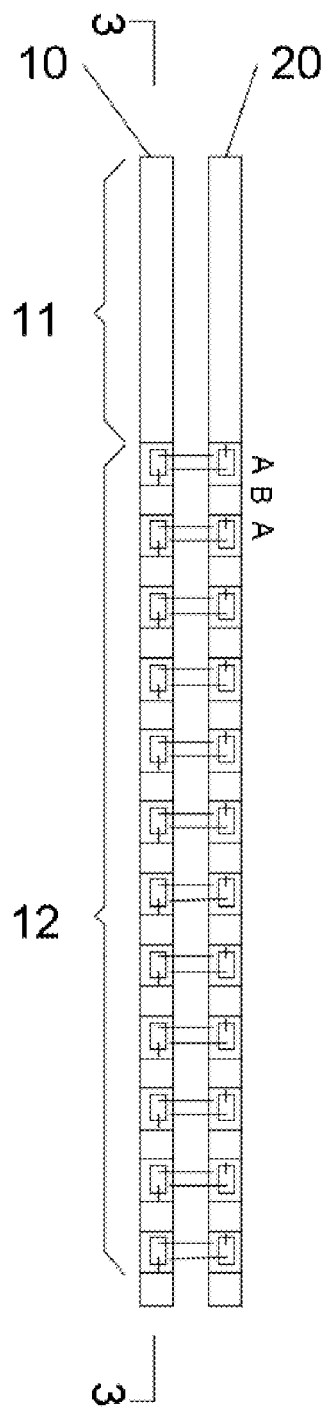
FIG. 11 is a structural schematic view of a LED filament according to a seventh embodiment of the disclosure.
Figure 12:
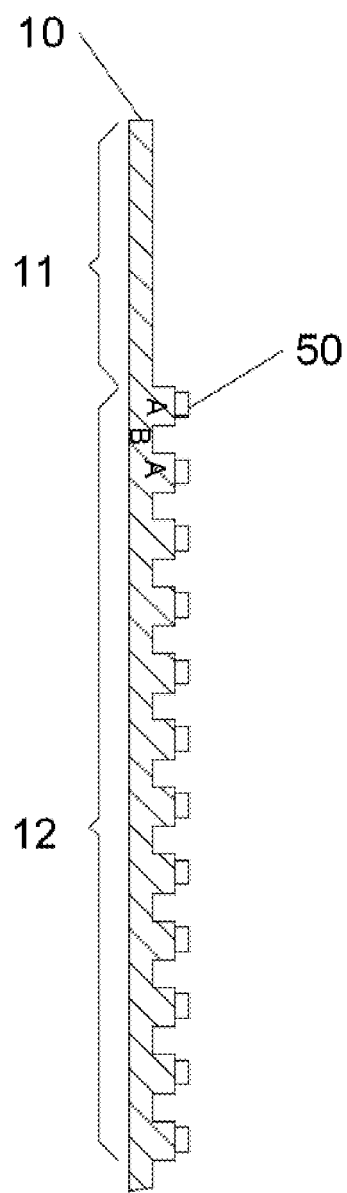
FIG. 12 is a cross-sectional view of FIG. 11 taken along 3-3.

Referring to FIG. 11 and FIG. 12, in the embodiment, the structure of the first bracket 10 and that of the second bracket 20 are the same. The die bonding region A of the first bracket 10 is a convex shape with a flat surface. The first bracket 10 and the second bracket 20 are both fixed with multiple LED chips. Two ends of the LED chips are electrically connected with the first bracket 10 and the second bracket 20.

Overall, the LED filament of the disclosure at least has following advantages.

The cross-sectional area of the die bonding region is larger than that of the connection region in the disclosure, so that the deformation of connection region is considerable and the deformation of the die bonding region is subtle when the LED filament suffers forces, and the LED chips will not be destroyed easily.

In the disclosure, as the LED chips or each of the groups of LED chips are parallel connected, even though parts of the LED chips are destroyed or the wire is broken, the LED filament will not be completely destroyed.

The descriptions above are merely preferred embodiments of the disclosure, which cannot limit the protection scope of the disclosure. Although the disclosure is disclosed with reference to the preferred embodiments previously, the disclosure will not be restricted as such. A person skilled in the art can achieve equivalent embodiments such as modification according to the disclosed embodiments. Any simply modification, equivalent transformation within the contents of the disclosure should be included in the protected scope of the disclosure.

What is claimed is:

1. A LED filament, comprising a plurality of LED chips, a first bracket and a second bracket, the plurality of LED chips being secured on the first bracket and/or the second bracket, the first bracket and the second bracket made out of metal;
the plurality of LED chips being divided into groups of serially connected LED chips, and two ends of each of the groups of serially connected LED chips being electrically connected with the first bracket and the second bracket respectively; wherein the groups are parallel connected with each other;
wherein the first bracket comprises a die bonding section, the die bonding section comprises a die bonding region and a connection region, a cross-sectional area of the die bonding region is larger than a cross-sectional area of the connection region, the die bonding region has the LED chip fixed therein.

2. The LED filament according to claim 1, wherein the second bracket comprises a power supply section, the power supply section comprises a third region and a fourth region, a cross-sectional area of the fourth region is larger than a cross-sectional area of the third region.

3. The LED filament according to claim 1, wherein a cross-sectional area of the die bonding section gradually decreases from middle of the die bonding region to middle of the connection region.

4. The LED filament according to claim 3, wherein the die bonding region and the connection region are plate-shaped structures, a first border surface on the die bonding region and the connection region closer to the second bracket is perpendicular to a surface of the die bonding region fixing the LED chips, a sectional curve of the first border surface and the surface of the die bonding region fixing the LED chips is a sinusoid.

5. The LED filament according to claim 4, wherein there is a gap between the first bracket and the second bracket.

6. The LED filament according to claim 1, wherein the first bracket and the second bracket are wrapped by a transparent layer.

7. The LED filament according to claim 6, wherein a first lead and a second lead are extended out of the transparent layer from the first bracket and the second bracket.

8. The LED filament according to claim 7, wherein the second lead is located on an end of the second bracket adjacent to the first lead.

9. The LED filament according to claim 1, wherein the first bracket and the second bracket are mutually fixed together by an insulating member.

10. The LED filament according to claim 9, wherein the insulating member is made of an epoxy resin.

11. A lamp, wherein the lamp comprises a LED filament as a light source, the LED filament comprises a plurality of LED chips, a first bracket and a second bracket, the LED chips are secured on the first bracket and/or the second bracket, the first bracket and the second bracket are made out of metal; the plurality of LED chips are divided into groups of serially connected LED chips, and two ends of each of the groups of serially connected LED chips are electrically connected with the first bracket and the second bracket respectively; wherein the groups are parallel connected with each other;
wherein the first bracket comprises a die bonding section, the die bonding section comprises a die bonding region and a connection region, a cross-sectional area of the die bonding region is larger than a cross-sectional area of the connection region, the die bonding region has the LED chip fixed therein.

12. The lamp according to claim 11, wherein the second bracket comprises a power supply section, the power supply section comprises a third region and a fourth region, a cross-sectional area of the fourth region is larger than a cross-sectional area of the third region.

13. The lamp according to claim 11, wherein a cross-sectional area of the die bonding section gradually decreases from middle of the die bonding region to middle of the connection region.

14. The lamp according to claim 13, wherein the die bonding region and the connection region are plate-shaped structures, a first border surface on the die bonding region and the connection region closer to the second bracket is perpendicular to a surface of the die bonding region fixing the LED chips, a sectional curve of the first border surface and the surface of the die bonding region fixing the LED chips is a sinusoid.

15. The lamp according to claim 14, wherein there is a gap between the first bracket and the second bracket.

16. The lamp according to claim 11, wherein the first bracket and the second bracket are wrapped by a transparent layer.

17. The lamp according to claim 16, wherein a first lead and a second lead are extended out of the transparent layer from the first bracket and the second bracket.

18. The lamp according to claim 17, wherein the second lead is located on an end of the second bracket adjacent to the first lead.

19. The lamp according to claim 11, wherein the first bracket and the second bracket are mutually fixed together by an insulating member.

20. The lamp according to claim 19, wherein the insulating member is made out of an epoxy resin.

* * * * *